US006001703A

United States Patent [19]

Winer et al.

[11] Patent Number: 6,001,703

[45] Date of Patent: Dec. 14, 1999

[54] METHOD OF FORMING A FIDUCIAL FOR ALIGNING AN INTEGRATED CIRCUIT DIE

[75] Inventors: Paul Winer, Santa Clara; Richard H. Livengood, Los Gatos, both of Calif.

[73] Assignee: Intel Corporation, Santa Clara, Calif.

[21] Appl. No.: 08/978,535

[22] Filed: Nov. 26, 1997

Related U.S. Application Data

[62] Division of application No. 08/771,275, Dec. 20, 1996.

[51] Int. Cl.[6] .................. H01L 21/76

[52] U.S. Cl. .................. 438/401; 438/401; 438/975; 148/DIG. 102

[58] Field of Search .................. 257/797; 438/401, 438/975; 148/DIG. 102

[56] References Cited

U.S. PATENT DOCUMENTS

| | | |
|---|---|---|
| 4,479,830 | 10/1984 | Koshino et al. . |
| 5,241,454 | 8/1993 | Ameen et al. . |
| 5,304,839 | 4/1994 | Chen et al. . |
| 5,365,103 | 11/1994 | Brown et al. . |
| 5,612,573 | 3/1997 | Lewis . |

FOREIGN PATENT DOCUMENTS

| | | | |
|---|---|---|---|
| 88305199 | 8/1988 | European Pat. Off. | H01L 21/66 |

OTHER PUBLICATIONS

"Shield for Protecting an Integrated Circuit During Etch of Silicon Substrate," IBM Technical Disclosure Bulletin, vol. 38 (2), 1995.

*Primary Examiner*—John F. Niebling
*Assistant Examiner*—Jennifer M. Kennedy
*Attorney, Agent, or Firm*—Blakely, Sokoloff, Taylor & Zafman LLP

[57] ABSTRACT

A fiducial for aligning an integrated circuit die. In one embodiment, the fiducial is configured to be exposed by laser chemical etching through a silicon substrate through the back side of a C4 packaged integrated circuit die. The presently described fiducial includes floating diffusion regions disposed in the substrate. An oxide layer free of metal contacts is disposed over the diffusion regions within the fiducial region of the integrated circuit. A metal pattern layer is disposed beneath the oxide layer to provide alignment information. The metal pattern layer is configured to be visible through the oxide layer after the silicon substrate has been removed from the fiducial region. A light block is disposed between the metal pattern layer and an underlying epoxy underfill layer to minimize the risk of an excessive amount of light from being exposed to the underlying epoxy layer, which minimizes the risk of the epoxy layer from damaging the integrated circuit from excessive light exposure. Since the presently described fiducial does not include any contacts in the oxide layer, the additional step of utilizing a focus ion beam mills no longer necessary and the presently described fiducial therefore only needs to be etched with a laser chemical etcher to be exposed.

7 Claims, 4 Drawing Sheets

301

303 305 331 313 329 307 329 309 311 329 321 329 323 327 325 EPOXY

METHOD OF FORMING A FIDUCIAL FOR ALIGNING AN INTEGRATED CIRCUIT DIE

This is a divisional of application Ser. No. 08/771,275, filed Dec. 20, 1996.

BACKGROUND OF THE INVENTION

1. Field of the Invention

The present invention relates generally to the field of integrated circuit testing and more particularly to an alignment mark in an integrated circuit die for aligning and navigating through an integrated circuit die.

2. Description of the Related Art

Once a newly designed integrated circuit has been formed on a silicon substrate, the integrated circuit must be thoroughly tested to ensure that the circuit performs as intended. Any portion of the integrated circuit which does not function properly must be identified so that it can be fixed by modifying the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

During the debugging process, it is often necessary to navigate to certain locations in the integrated circuit to access certain integrated circuit nodes to, for example, collect important electrical data and information.

When debugging integrated circuits, it is sometimes impossible to obtain an electrical signal of interest from a pin or a bond pad from the integrated circuit package or die. In these instances, the electrical signal of interest is located at an internal integrated circuit node to which there is no connected probe point. In this situation, the substrate of the integrated circuit die is milled to expose the electrical node of interest to allow signals to be obtained directly. Naturally, it is important that the integrated circuit die is properly aligned so that probe point locations can be accurately located and determined. That is, the location of a probe hole must be determined with very high precision since the milling of an improperly placed hole can destroy the integrated circuit die if milled through an important integrated circuit components such as for example a transistor.

In order to ensure that an integrated circuit die is properly aligned and positioned so that navigation to the probe locations that will be milled can be precisely determined, alignment marks or fiducials are disposed directly in the integrated circuit die. FIG. 1 illustrates a surface view of the bottom of a controlled collapse chip connection (C4) chip 101 from which it is desired to collect electrical data from an integrated circuit node 103. C4 packaged chip 101 includes an integrated circuit die 111 mounted on a C4 package 113. Integrated circuit node 103 is buried beneath the surface of the integrated circuit die 111.

In order to probe integrated circuit node 103, the substrate above integrated circuit node 103 must be carefully removed so that integrated circuit node 103 can be exposed. Before the substrate of the integrated circuit die is milled, the precise location of integrated circuit node 103 must be accurately determined. In order to accurately determine the location of integrated circuit node 103, fiducials 105, 107 and 109 are formed in integrated circuit die 111 to provide points of reference when positioning and navigating through integrated circuit die 111. Since fiducials 105, 107 and 109 are formed beneath the substrate of integrated circuit die 111, they must also be exposed so that they can be accessed during the debug process.

FIG. 2 is an illustration of a cross-section of a fiducial 201. Fiducial 201 is disposed in a fiducial region located between dotted lines labeled 203 and 205 of an integrated circuit die. As shown in FIG. 2, fiducial 201 includes diffusion regions 207, 209 and 211 disposed in the substrate 213 of the integrated circuit die. Tungsten metal contacts 215, 217 and 219 are disposed in an oxide layer 221. Metal contacts 215, 217 and 219 provide electrical access to diffusion regions 207, 209 and 211 respectively. A metal pattern 223 is disposed beneath oxide layer 221. Metal pattern 223 provides alignment information for use during the positioning of and navigation through the integrated circuit die. An epoxy layer 225 is disposed beneath the integrated circuit die to bond the integrated circuit die to the C4 package (not shown).

In order to access fiducial 201 for alignment purposes, it is necessary to remove the substrate 213 within the fiducial region bounded by dotted lines 203 and 205. Present day techniques utilize a laser chemical etcher to remove most of substrate 213. The laser chemical etch procedure is stopped just short of reaching oxide layer 221. A focused ion beam (FIB) milling tool is used to remove the final remainder of substrate 213 down to oxide layer 221.

It is noted that the FIB milling tool must be used to mill the remaining portion of substrate 213 since metal contacts 215, 217 and 219 are exceptionally sensitive to laser chemical etching. In particular, it is noted that if a laser chemical etch is performed all the way down to oxide layer 221 using present day techniques, a catastrophic acceleration of the etching process occurs at metal contacts 215, 217 and 219. This catastrophic acceleration is the result of metal contacts 215, 217 and 219 being etched at a much higher rate than oxide layer 221 when using a laser chemical etch. Consequently, fiducial 201 may be damaged when contacts 215, 217 and 219 are etched with a laser chemical etcher. By stopping short of oxide layer 221 with the laser chemical etcher and completing the fiducial exposure process with an FIB milling tool, the risks of the catastrophic etching of contacts 215, 217 and 219 are reduced. The requirement of stopping short of oxide layer 221 and the additional of the step of milling the remaining portion of substrate 213 with a FIB milling tool results in an undesirable increase in the amount of time required to expose fiducial 201.

It is also noted that after substrate 213 is removed from fiducial 201, special care must be given to fiducial 201 to prevent excessive amounts of light from being exposed to the epoxy layer 225. For example, in some instances when epoxy layer 225 is exposed to an excessive amount of laser light, epoxy layer 225 may boil and expand, consequently rupturing the adjacent substrate and destroying the fiducial and the surrounding integrated circuit.

Therefore, what is desired is a fiducial that does not require both a laser chemical etch and a focused ion beam mill to expose a fiducial for aligning an integrated circuit. Such a fiducial should have the ability to be exposed using only a laser chemical etch. The fiducial should not suffer from the risk of being destroyed because of the catastrophic etching of metal contacts in the oxide layer. In addition, the fiducial should also have a minimal risk of being damaged from the exposure light to an epoxy underfill layer.

SUMMARY OF THE INVENTION

A fiducial for aligning an integrated circuit die is described. In one embodiment, the fiducial is disposed in a fiducial region of the integrated circuit die. A diffusion region is disposed in the fiducial region of a substrate of the integrated circuit die. An oxide layer without a contact is disposed over the diffusion region in the fiducial region of the integrated circuit die. A metal pattern is disposed over the oxide layer in the fiducial region of the integrated circuit die. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A fiducial for aligning an integrated circuit die is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

The present invention features a light blocking path and a fiducial region that contains a floating diffusion, but is free of metal contacts. The present invention includes a metal pattern layer that provides alignment information that may be used during debug of the integrated circuit die. In one embodiment, the light blocking path protects an epoxy underfill layer in a C4 mounted integrated circuit die after a substrate layer has been cleared and removed from the fiducial. The floating diffusion region of the present invention provides a topography in the oxide layer, which provides additional alignment information in combination with the metal pattern layer of the presently described fiducial.

Figure 1:
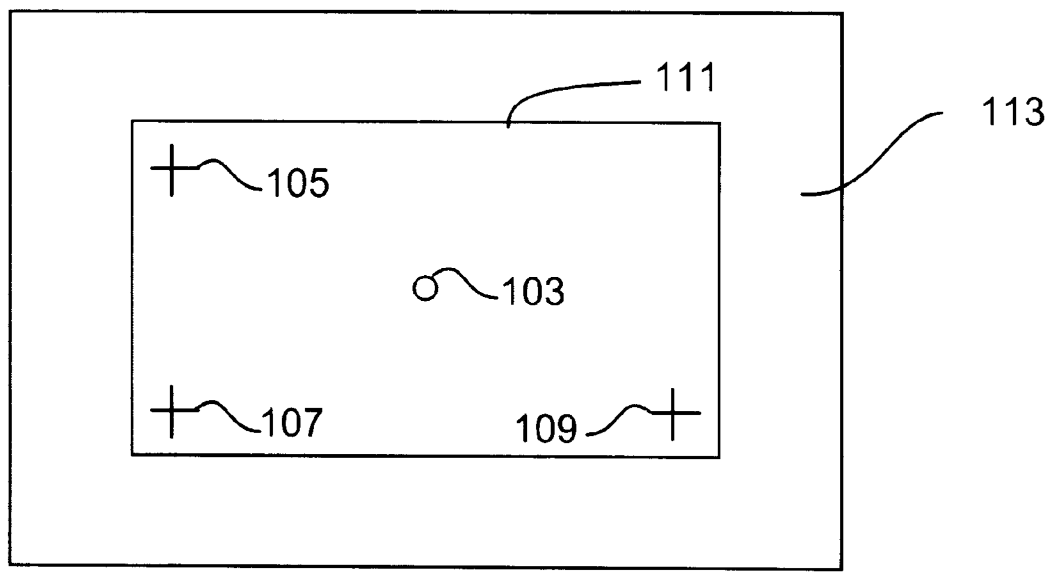
FIG. 1 is an illustration of fiducials arranged in an integrated circuit die for aligning the integrated circuits die to precisely locate an integrated circuit node of interest.
Figure 2:
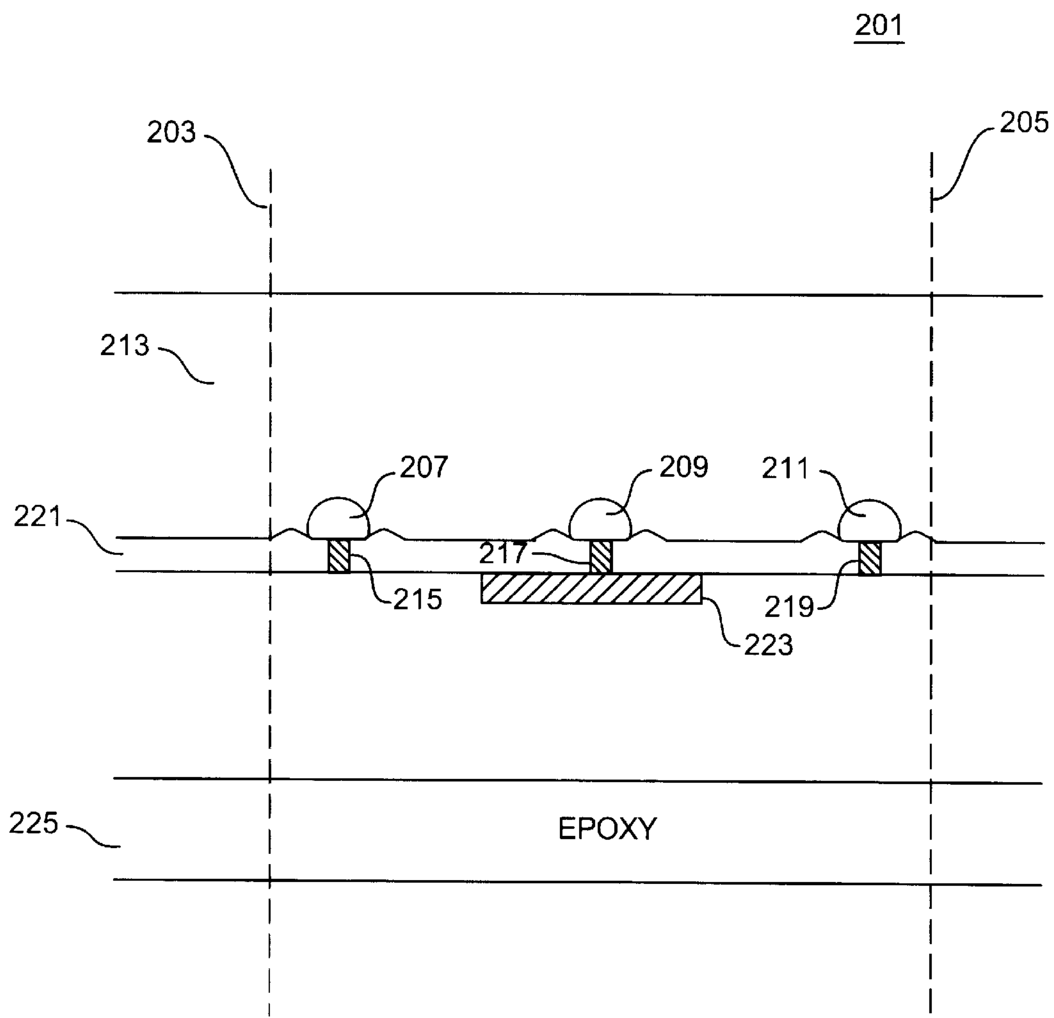
FIG. 2 is an illustration of a cross-section of a prior art fiducial.
Figure 3:
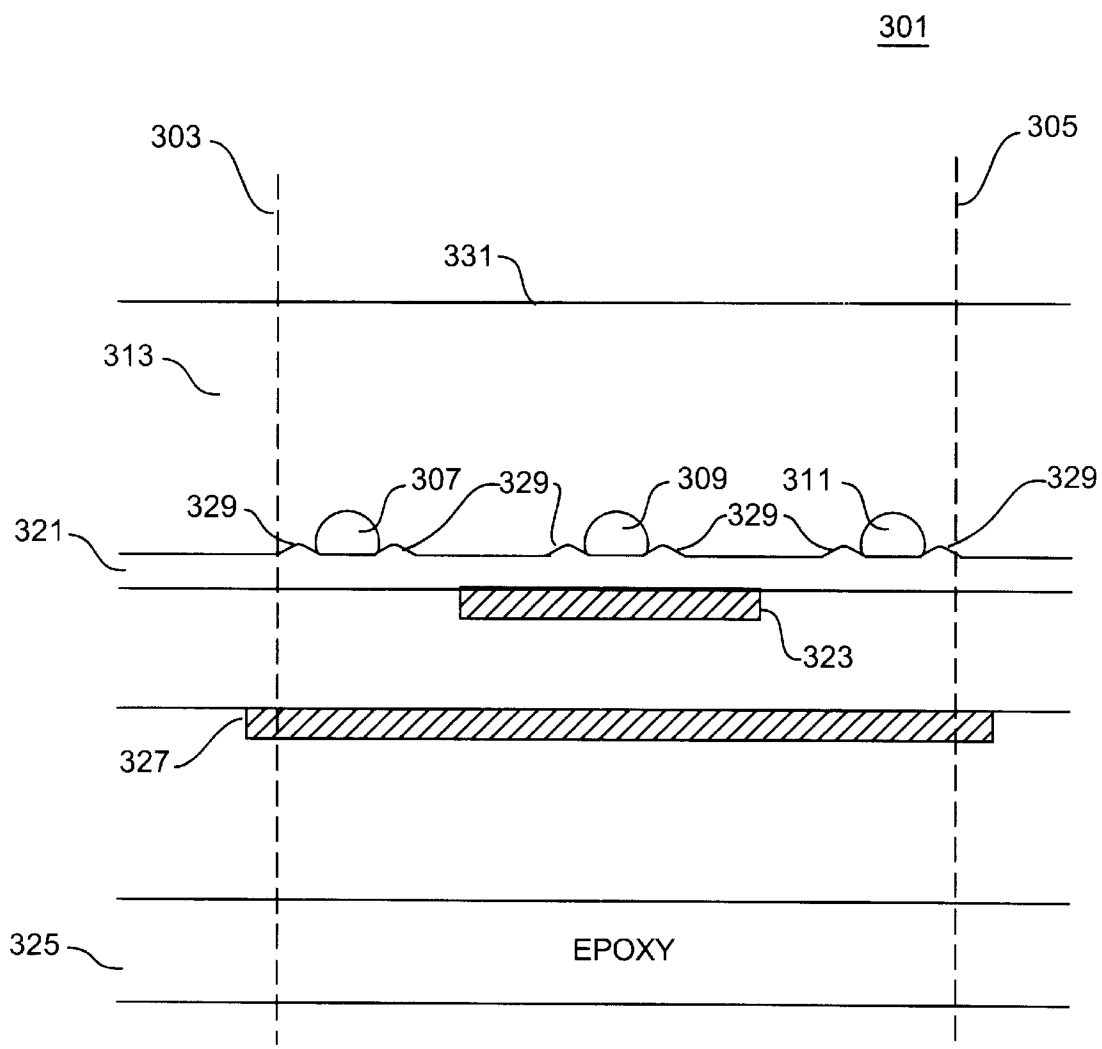
FIG. 3 is an illustration of a cross-section of a fiducial in accordance with the teachings of the present invention.

FIG. 3 is an illustration a cross-section of a fiducial 301 in accordance with the teachings of the present invention. Fiducial 301 is formed in an integrated circuit die in a fiducial region disposed between dotted lines 303 and 305 of FIG. 3. In one embodiment of the present invention, fiducial 301 includes diffusion regions 307, 309 and 311 floating in substrate 313 of the integrated circuit die. When fiducial 301 is formed, oxide layer 321 is formed over diffusion regions 307, 309 and 311 as shown in FIG. 3. A layer of metal is then formed such that a metal pattern 323 is formed over the oxide layer 321 within the fiducial region disposed between dotted lines 303 and 305 in FIG. 3. A layer of epoxy 325 is formed beneath the integrated circuit die in fiducial 301 to bond the integrated circuit die to an underlying C4 package (not shown). In one embodiment of the present invention, light block 327 is disposed between the metal pattern 323 and the epoxy underfill layer 325 in the fiducial region between dotted lines 303 and 305 as shown in FIG. 3.

Fiducial 301 is configured to be exposed from the back side 331 of the integrated circuit die by removing substrate 313 and diffusion regions 307, 309 and 311. In one embodiment of the present invention, substrate layer 313 and diffusion regions 307, 309 and 311 are comprised of silicon and only a laser chemical etch is used to completely remove the entire substrate layer 313 and diffusion regions 307, 309 and 311 down to oxide layer 321. After substrate layer 313 and diffusion regions 307, 309 and 311 are removed, metal pattern 323 is visible through oxide layer 321 for aligning and positioning the integrated circuit die.

In one embodiment of the present invention, the laser chemical etch process used to remove substrate layer 313 and diffusion regions 307, 309 and 311 has a high selectivity of silicon over oxide. To illustrate, the silicon of substrate layer 313 and diffusion regions 307, 309 and 311 are milled at a rate of X using the laser chemical etch. In comparison, the oxide of oxide layer 321 is milled at a substantially slower rate of X/1000 by the same laser chemical etch process. As a result, etching effectively stops when oxide layer 321 is reached after substrate layer 313 and diffusion regions 307, 309 and 311 are entirely removed with the laser chemical etch.

Since oxide layer 321 is free of metal contacts within the fiducial region disposed between dotted lines 303 and 305, the present invention does not suffer the same catastrophic acceleration of the etching process when metal contacts are reached with a laser chemical etch in the prior art. In contrast with prior art fiducial 201, the additional FIB milling step is no longer needed to remove a final remaining portion of substrate layer 313 since the laser chemical etch may be used to remove the entire substrate 313 and diffusion regions 307, 309 and 311 because the oxide layer 321 is free of metal contacts.

It is acknowledged that the metal contacts 215, 217 and 219 of prior art fiducial 201 are useful to the effect that they provide alignment information that may be used during the debug process. It is appreciated, however, that the presently described fiducial 301 also provides similar alignment information with the topography 329 on oxide layer 321. In particular, it is noted that by forming the floating diffusion regions 307, 309 and 311 in substrate 313, corresponding ridges are formed in oxide layer 321 that result in topography 329 near each respective diffusion region 307, 309 and 311. That is, by providing floating diffusion regions 307, 309 and 311 in fiducial 301, topography 329 in oxide layer 321 provides information that may be used to help align the integrated circuit die during the debug process. Accordingly, topography 329 in oxide layer 321 may be used in combination with metal pattern 323 for alignment and navigation purposes of the integrated circuit die.

In another embodiment of the present invention, light block 327 is disposed between the metal pattern 323 and epoxy underfill layer 325. Light block 327 protects epoxy underfill layer 325 from being exposed to an excessive amount of light. As shown in FIG. 3, light block 327 is located within the fiducial region disposed between dotted lines 303 and 305. In one embodiment of the present invention, light block 327 protects the epoxy underfill layer 325 in a C4 packaged integrated circuit die from laser light that may shine through the back side 331 of the integrated circuit die through oxide layer 321 after substrate layer 313 has been removed with a laser chemical etch.

Figure 4:
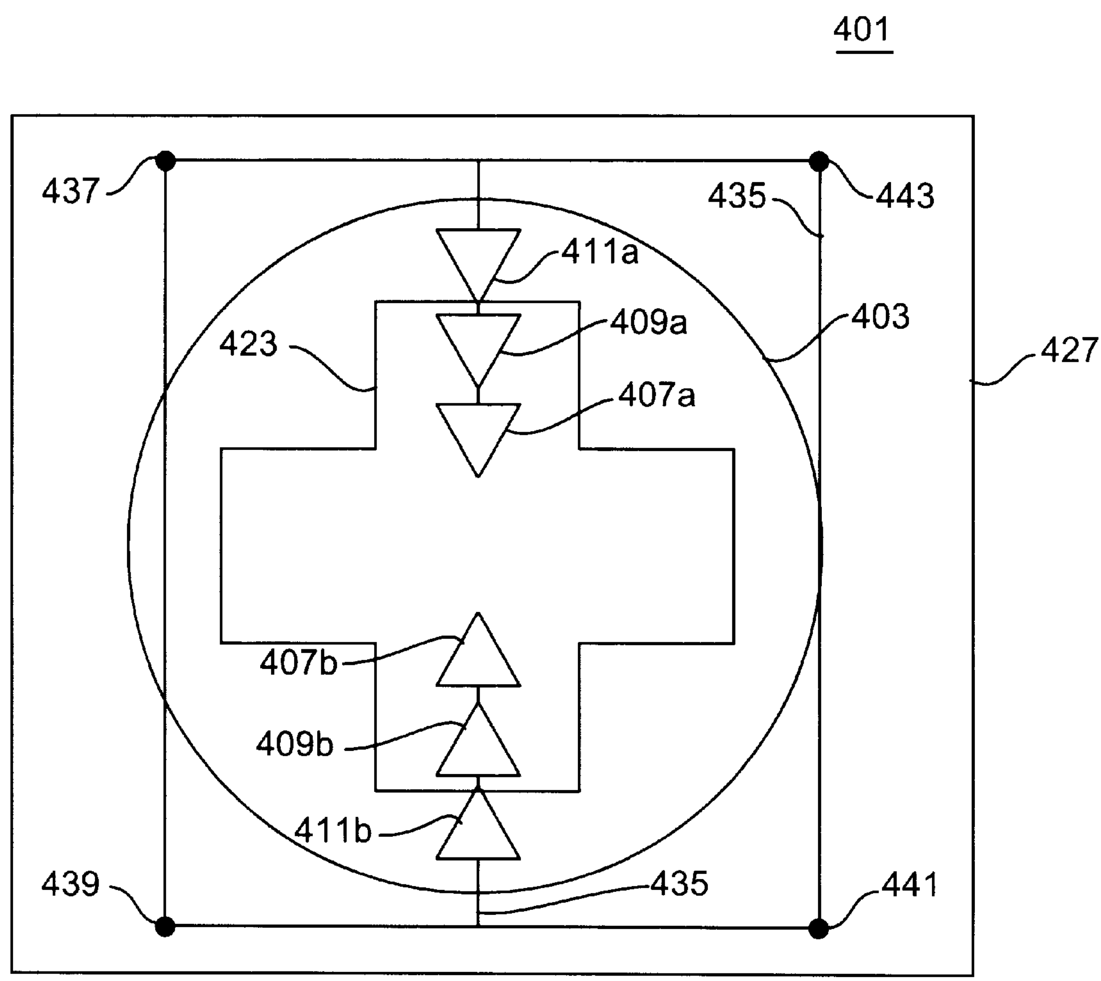
FIG. 4 is an illustration of a view of a fiducial from the back side of the integrated circuit die in accordance with the teachings of the present invention.

FIG. 4 is an illustration of a fiducial 401 as viewed from the back side of the integrated circuit die in accordance with the teachings of the present invention. Fiducial 401 includes diffusion regions 407A, 409A, 411A, 407B, 409B and 411B which are floating diffusions disposed in the substrate (not shown) of the integrated circuit die. Diffusions 407A, 409A, 411A, 407B, 409B and 411B are located within the fiducial region 403.

Diffusions regions 407A, 409A, 411A, 407B, 409B and 411B are coupled together with a diffusion bar 435, which is also disposed outside and around diffusion region 403 as shown in FIG. 4. Diffusion bar 435 is coupled to contacts 437, 439, 441 and 443 to provide an external electrical connection to diffusion regions 407A, 409A, 411A, 407B, 409B and 411B. It is appreciated that metal contacts 437, 439, 441 and 443 are all disposed outside of the fiducial region 403 as shown in FIG. 4. With the diffusion regions 407A, 409A, 411A, 407B, 409B and 411B shown in FIG. 4, topography is formed in the oxide layer (not shown), which is disposed between the diffusion regions 407A, 409A, 411A, 407B, 409B and 411B and a metal pattern 423.

After the substrate and diffusion regions 407A, 409A, 411A, 407B, 409B and 411B have been removed from fiducial 401 in accordance with the teachings of the present invention, metal pattern 423 is visible through the oxide layer and provides alignment and navigation information for the integrated circuit die. Light block 427 is disposed between metal pattern 423 and an epoxy underfill layer (not shown). Light block 427 protects the epoxy underfill layer from laser light that may shine from the back side of the integrated circuit die through the oxide layer.

It is appreciated that when the substrate layer and diffusion regions 407A, 409A, 411A, 407B, 409B and 411B have been removed, all milling of the substrate occurs within fiducial region 403. That is, no laser chemical etching occurs outside of fiducial region 403. Accordingly, metal contacts 437, 439, 441 and 443 are not exposed to any of the effects of the laser chemical etch process. Furthermore, since the boundaries of fiducial region 403 are entirely within the boundaries of light block 427 as shown in FIG. 4, light block 427 adequately protects the underlying epoxy underfill layer from any laser light that may shine through an opening in the substrate after the oxide layer and metal pattern 423 of fiducial 401 have been exposed.

In sum, the presently described fiducial eliminates the prior art step of removing a portion of the substrate with a FIB milling tool. This additional step is no longer necessary since the presently described oxide layer between the diffusion regions and the metal pattern layer is free of metal contacts. The elimination of this step results in a significant reduction of throughput time for exposing fiducials and therefore reduces the overall debug time of an integrated circuit die. Moreover, with the light block of the present invention, the underlying epoxy underfill layer is protected from excessive light, which reduces the risks of inadvertently damaging integrated circuit dies during debug.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method of forming a fiducial for aligning an integrated circuit die, the fiducial disposed in a fiducial region of the integrated circuit die, the method comprising:

disposing a diffusion region in a substrate of the integrated circuit die in the fiducial region;

disposing an oxide layer over the diffusion region without a contact to the diffusion region within the fiducial region; and disposing a metal pattern over the oxide layer in the fiducial region.

2. The method described in claim 1 further comprising disposing a light block in the fiducial region between the metal pattern and an epoxy underfill layer.

3. The method described in claim 2 wherein the integrated circuit die is comprised in a controlled collapse chip connection (C4) packaged chip.

4. The method described in claim 1 further comprising exposing the fiducial from a back side of the integrated circuit die.

5. The method described in claim 4 wherein the exposing is performed with a laser chemical etcher without a focused ion beam mill.

6. The method described in claim 1 wherein the substrate comprises silicon.

7. The method described in claim 1 further comprising coupling the diffusion region to a contact disposed outside the fiducial region.

* * * * *